(12) United States Patent
Pandey

(10) Patent No.: US 11,783,108 B2
(45) Date of Patent: Oct. 10, 2023

(54) SYSTEM MEMORY-AWARE CIRCUIT REGION PARTITIONING

(71) Applicant: International Business Machines Corporation, Armonk, NY (US)

(72) Inventor: Diwesh Pandey, Jeevan Bhima Nagar (IN)

(73) Assignee: International Business Machines Corporation, Armonk, NY (US)

(*) Notice: Subject to any disclaimer, the term of this patent is extended or adjusted under 35 U.S.C. 154(b) by 168 days.

(21) Appl. No.: 17/369,329

(22) Filed: Jul. 7, 2021

(65) Prior Publication Data
US 2023/0008569 A1    Jan. 12, 2023

(51) Int. Cl.
*G06F 30/398*    (2020.01)
*G06F 30/392*    (2020.01)
*G06F 30/394*    (2020.01)

(52) U.S. Cl.
CPC .......... *G06F 30/392* (2020.01); *G06F 30/394* (2020.01); *G06F 30/398* (2020.01)

(58) Field of Classification Search
CPC .... G06F 30/394; G06F 30/398; G06F 30/392; G06F 30/39; G06F 2119/18; G06F 30/327; G06F 30/367; G06F 3/017; G06F 1/163; G06F 2119/12; G06F 2119/06; G06F 3/00; G06F 2111/04; G06F 30/20; G06F 30/30; G06F 30/3323; G06F 2111/08; G06F 2119/02; G06F 30/373; G06F 1/10; G06F 18/23; G06F 18/24; G06F 30/33; G06F 30/3308; G06F 30/3312; G06F 30/333; G06F 30/396; G06F 1/20; G06F 16/5854;
(Continued)

(56) References Cited

U.S. PATENT DOCUMENTS 10,192,021 B1 * 1/2019 Raj ...................... G06F 30/398
10,943,051 B1 * 3/2021 Surprise ............... G06F 30/394
(Continued)

OTHER PUBLICATIONS

Patil A. Flow Based Logic Design Partitioning. International Journal of Engineering Research & Technology (IJERT). 2020;9(07): pp. 1419-1424. Jul. 2020.
Lai YH, Chang YL, Fang JP, Lee J. Simultaneous layer-aware and region-aware partitioning for 3D IC. In2016 IEEE Asia Pacific Conference on Circuits and Systems (APCCAS) Oct. 25, 2016 (pp. 502-505). IEEE.
Wikipedia, Sweep Line Algorithm, pp. 1-2, downloaded Jun. 23, 2021 from https://en.wikipedia.org/wiki/Sweep_line_algorithm, page was last edited on Nov. 5, 2020.
(Continued)

*Primary Examiner* — Binh C Tat
(74) *Attorney, Agent, or Firm* — Erik Johnson; Otterstedt & Kammer PLLC

(57) ABSTRACT

To increase the efficiency of an electronic design automation (EDA) process, for a putative integrated circuit design for which computerized routing is to be carried out within an EDA program, run a sweep line algorithm selectively on active metal shapes in said putative design for different layers, to determine a total number of said active metal shapes, and compute a memory requirement for computerized routing on said active shapes based on said total number of said active shapes. For said putative design, compute a memory requirement for computerized routing on inactive metal shapes based on a total number of said inactive shapes; partition said putative design into a plurality of partitions, based on said memory requirement for computerized routing on said active and inactive shapes, such that an available system memory is not exceeded. Separately run a routing job on each of said plurality of partitions.

19 Claims, 8 Drawing Sheets

(58) Field of Classification Search
CPC .............. G06F 2111/10; G06F 2111/12; G06F 2117/06; G06F 30/331; G06F 30/347; G06F 7/5443; G06F 11/267; G06F 16/532; G06F 16/9024; G06F 17/18; G06F 18/2433; G06F 21/602; G06F 2111/02; G06F 2111/20; G06F 2117/08; G06F 2119/08; G06F 3/011; G06F 30/18; G06F 30/323; G06F 30/337; G06F 30/36; G06F 30/3953; G06F 18/23213; G06F 2119/16; G03F 1/36; G03F 9/7076; G03F 9/7084; G03F 1/70; G03F 7/70; G03F 7/70441; G03F 7/70433; G03F 1/42; G03F 7/70666; G03F 7/705; H01L 27/0207; H01L 2224/73265; H01L 2924/15311; H01L 21/76898; H01L 24/48; H01L 23/49838; H01L 21/823412; H01L 27/0688; H01L 2224/32145; H01L 23/53214; H01L 23/53228; H01L 24/32; H01L 2224/30517; H01L 2224/30519; H01L 2224/30505
USPC .................................................. 716/100–108
See application file for complete search history.

(56) References Cited

U.S. PATENT DOCUMENTS

| | | |
|---|---|---|
| 2011/0055791 A1 | 3/2011 | Gao |
| 2011/0113400 A1 | 5/2011 | Melzner |
| 2017/0357744 A1 | 12/2017 | Mueller |
| 2020/0057835 A1 | 2/2020 | Pandey |
| 2020/0089836 A1* | 3/2020 | Lu .......................... G03F 1/70 |

OTHER PUBLICATIONS

Chang W, Chakraborty S. Resource-aware automotive control systems design: a cyber-physical systems approach. Foundations and Trends® in Electronic Design Automation. Dec. 28, 2016;10(4) cover pages, pp. i-11, pp. 1-121.

Chang W, Goswami D, Chakraborty S, Ju L, Xue CJ, Andalam S. Memory-aware embedded control systems design. IEEE Transactions on Computer-Aided Design of Integrated Circuits and Systems. Sep. 27, 2016;36(4): pp. 586-599.

Mutlu O, Subramanian L. Research problems and opportunities in memory systems. Supercomputing frontiers and innovations. Feb. 13, 2015;1(3): pp. 19-55.

* cited by examiner

Partition Computation:
Memory Requirement = M
Free Memory in System = Y
Required Partition = M/Y

| Region1 | Region2 |
| Region3 | Region4 |

200GB

SYSTEM MEMORY-AWARE CIRCUIT
REGION PARTITIONING

BACKGROUND

The present invention relates to the electrical, electronic, and computer arts, and more specifically, to semiconductor Electronic Design Automation (EDA) and the like.

In VLSI (very large-scale integration) digital design, fabricated devices conventionally include millions of transistors implementing hundreds of storage devices, functional logic circuits, and the like. EDA involves the use of software tools for designing electronic systems such as integrated circuits (ICs) (e.g., VLSI circuits) and printed circuit boards. The designs are often segmented or partitioned into sub-blocks (such as cores, units, macros, sub-hierarchies, and the like) to make the design process more manageable.

One aspect of design is routing: the routing stage of EDA takes a placed/optimized design, and determines how to create wires to connect all of the components, without causing manufacturing violations. The routing must typically consider design rules that vary in complexity based on the technology in use. For example, end-of-line rules in Extreme Ultraviolet (EUV) technology impose difficult design rules for VLSI routers.

SUMMARY

Principles of the invention provide techniques for system memory-aware circuit region partitioning. In one aspect, an exemplary method for increasing the efficiency of an electronic design automation process includes, for a putative integrated circuit design for which computerized routing is to be carried out within an electronic design analysis program, running a sweep line algorithm selectively on active metal shapes in said putative design for different layers of said putative design, to determine a total number of said active metal shapes, and computing a memory requirement for computerized routing on said active metal shapes based on said total number of said active metal shapes; for said putative integrated circuit design, computing a memory requirement for computerized routing on inactive metal shapes based on a total number of said inactive metal shapes; partitioning said putative integrated circuit design into a plurality of partitions, based on said memory requirement for computerized routing on said active metal shapes and said memory requirement for computerized routing on said inactive metal shapes, such that an available system memory is not exceeded; and separately running a routing job on each of said plurality of partitions.

In another aspect, an exemplary computer includes a memory; and at least one processor, coupled to the memory, and operative to increase the efficiency of an electronic design automation process by, for a putative integrated circuit design for which computerized routing is to be carried out within an electronic design analysis program, running a sweep line algorithm selectively on active metal shapes in said putative design for different layers of said putative design, to determine a total number of said active metal shapes, and computing a memory requirement for computerized routing on said active metal shapes based on said total number of said active metal shapes; for said putative integrated circuit design, computing a memory requirement for computerized routing on inactive metal shapes based on a total number of said inactive metal shapes; partitioning said putative integrated circuit design into a plurality of partitions, based on said memory requirement for computerized routing on said active metal shapes and said memory requirement for computerized routing on said inactive metal shapes, such that an available system memory is not exceeded; and separately running a routing job on each of said plurality of partitions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments provide one or more of:

improve the performance of a computer carrying out EDA by reducing runtime and/or memory requirements;

for fixed computer resources, improve the quality of an integrated circuit design as compared to a circuit designed using prior art techniques.

These and other features and advantages of the present invention will become apparent from the following detailed description of illustrative embodiments thereof, which is to be read in connection with the accompanying drawings.

DETAILED DESCRIPTION

One or more embodiments advantageously provide techniques of system memory-aware circuit region partitioning, which advantageously provide, for example, faster runtime and/or memory optimization. In one or more embodiments, obtain the memory of the system where the EDA program is running dynamically/on-the-fly. Based on the memory, determine how to optimize the program to run faster and/or to use available memory in an optimum manner. The chip size for a modern microprocessor for a high-end server, such as for hybrid cloud applications in 7 nm technology or beyond, might be on the order of 25 mm per side with an area of 625 mm$^2$. This example is a chip-level design. As the skilled artisan will appreciate, the routing in designs is typically done hierarchically. Sub-hierarchies are routed first, and then chip-level routing is carried out.

The core in such a case may contain on the order of a billion metal shapes on the metal layers. A huge amount of memory is required to process these shapes inside an EUV router. Such a router may take, for example, more than ~700 GB of memory to run. With the increase in memory, the run time also increases. As a result, the routing job may require ~12 hours of runtime.

The massive amount of memory typically requires a large, dedicated machine. Many times, a user does not find such a large, dedicated machine available and has to wait for availability before an analysis can be run. This problem is not limited to the chip level; most units also require huge memory (at least 200 GB). Therefore, the memory requirement problem is quite widespread for unit designs as well. The skilled artisan will appreciate that in order of decreasing size, a typical hierarchy is chip→unit→macro; units are typically large (e.g., 100 mm$^2$). Thus, a unit as used herein refers to an integration-level design, typically a large design in size (area), with high net count.

Advantageously, one or more embodiments enable running a routing job in smaller computer systems so that a user does not need to wait for availability of a dedicated high-memory machine. In one or more embodiments, dynamically compute the memory requirement to run the routing job. The memory requirement is directly proportional to the total metal shape count in the design. Compute the free memory in the machine. Based on available free memory, divide the chip into multiple partitions, so that each partition meets the memory requirement. Run an independent routing job in each partition. Indeed, one or more embodiments provide on-the-fly memory requirement computation based on metal shape processing and/or available free system memory and required program memory-driven chip partitioning.

Figure 1:
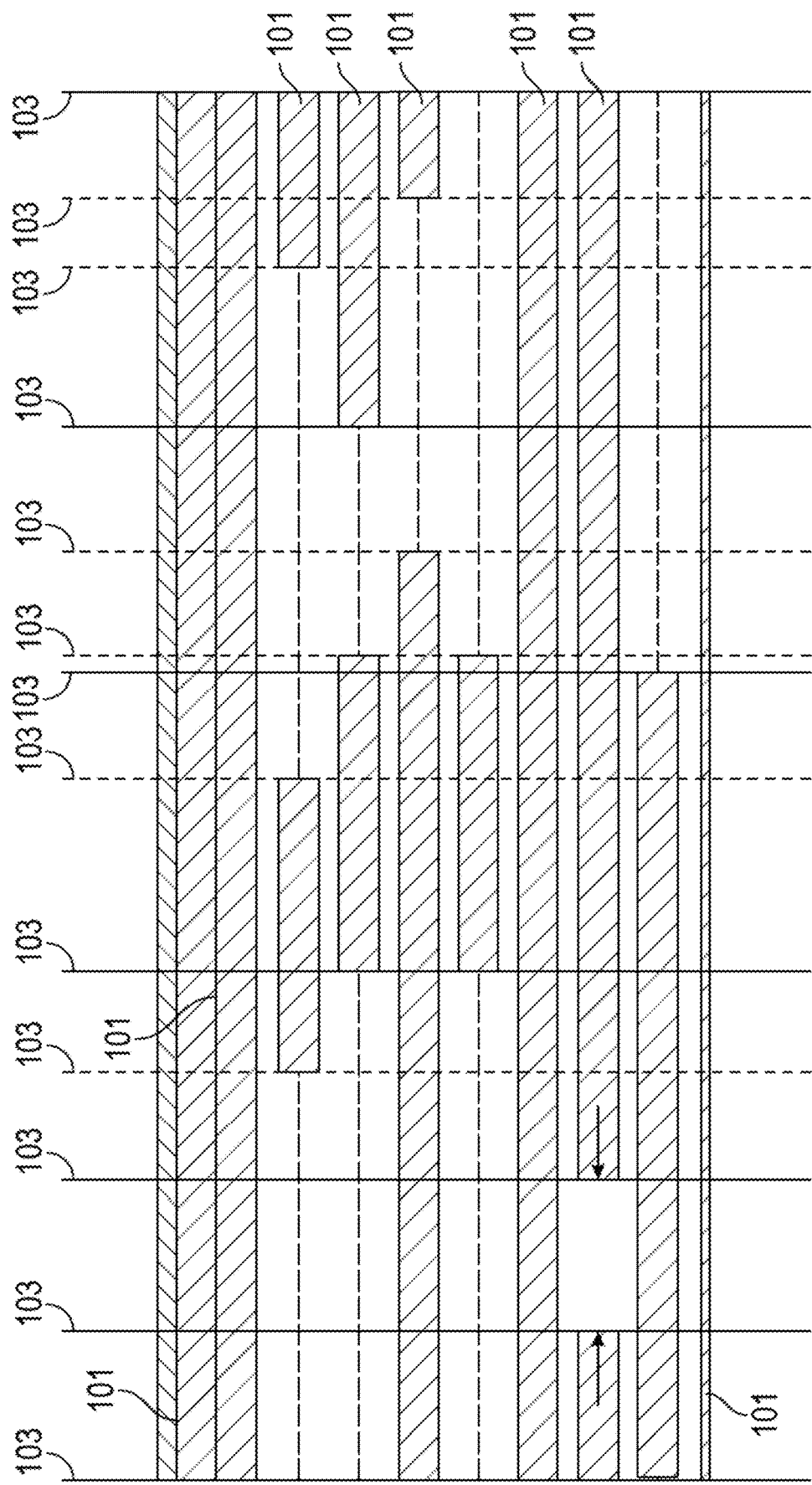
FIG. 1 depicts running a sweepline algorithm selectively on active metal shapes, in accordance with an exemplary embodiment.

Referring to FIG. 1, in one or more embodiments, run a sweepline algorithm selectively on active metal shapes in the design for different layers, and compute the storage (memory) requirement for these shapes. The sweepline algorithm counts the number of disjoint (active) metal shapes 101 (shown cross-hatched, not all are numbered to avoid clutter) in the design, for all the different metal layers. The greater the number of shapes, the more memory will be needed. In a non-limiting example, the sweepline algorithm traverses from left to right (it being understood that right-to-left, or some other approach, could be used in other embodiments). The vertical lines 103 are the sweeplines. The sweeplines are only created at the ends of the metal shapes. A vertical line is drawn for the end of each metal shape (in the actual algorithm, there is simply a single line traversing from left to right to scan the metal shapes). When the traversing line hits a (beginning) metal endpoint, it determines that it has hit a new shape and it records same. When the traversing line later hits an (ending) metal endpoint for that shape, it knows that the given shape is finished and has been completely tracked. For shapes that extend the entire width (e.g., top shape 101), the beginning and end are captured by the leftmost and rightmost sweep lines, respectively. Given the teachings herein, the skilled artisan can write code (e.g., Perl, Raku) to parse a data file such as is used in EDA to find the beginnings and endings of metal shapes (e.g., a design structure file such as GDS II, GL1, OASIS and the like as discussed below).

To compute the storage requirements, consider an array or list to hold the shapes. For example, each shape might be identified by the layer number, the shape number within that layer, the beginning X value, and the ending X value. Each shape with thus have two integer values (layer number, shape number) and two real values (beginning and ending X). The skilled person can determine, based on the precision (e.g., single or double), how much memory is needed for an array of two integer and two real values for each shape. For example, each shape will have a number of bytes=2×number of bytes per integer in the given system plus 2×number of bytes per floating point in the given system, with the total obtained by multiplying the total number of bytes per shape by the total number of shapes.

Figure 2:
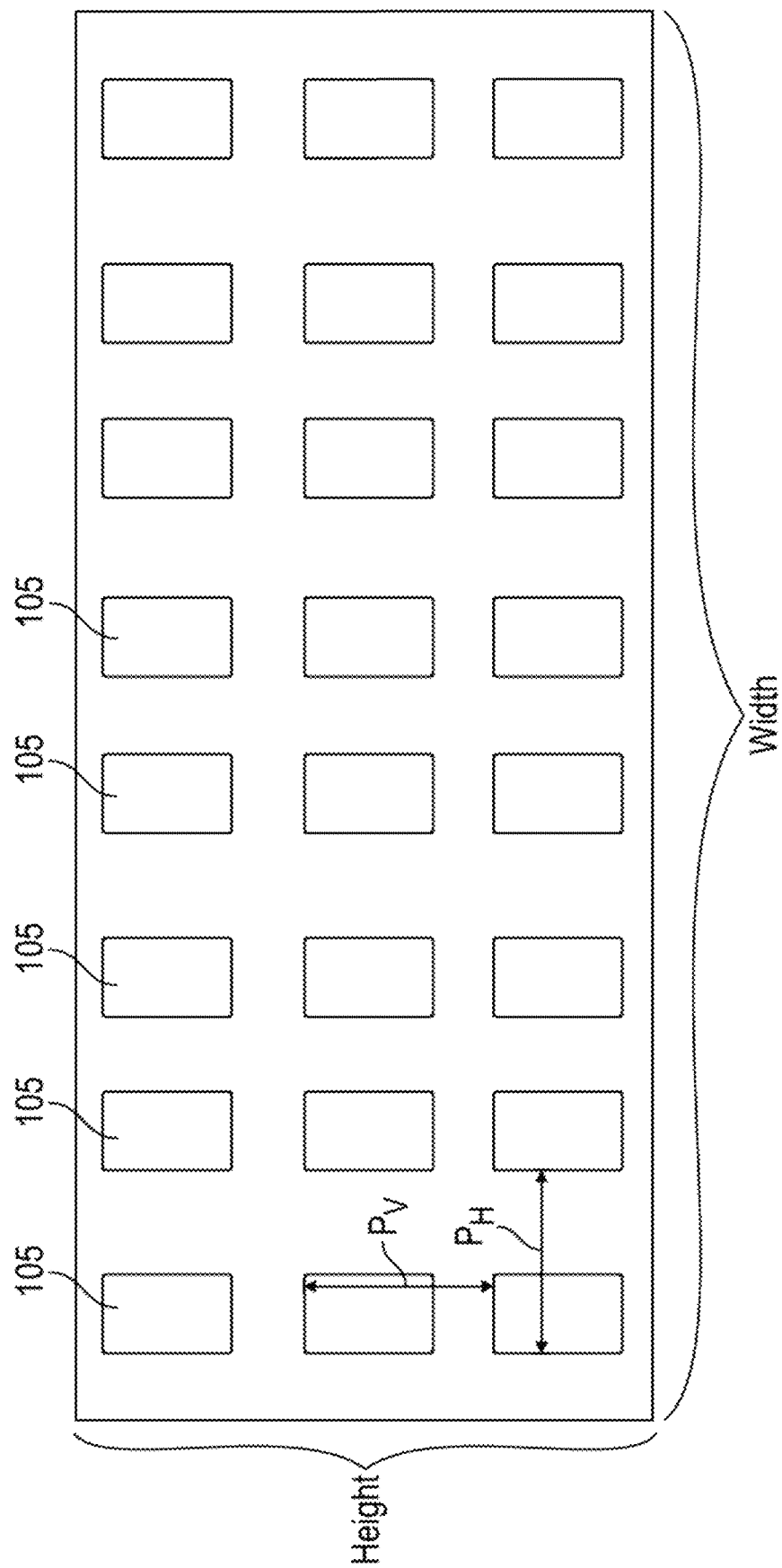
FIG. 2 depicts determining a number of inactive (fixed) shapes, in accordance with an exemplary embodiment.

Referring to FIG. 2, in one or more embodiments, compute the storage requirement for the inactive (fixed) shapes 105, such as power staple shapes and other blockage structures. To avoid clutter, not all shapes 105 are numbered. Since such shapes typically always occur in a fixed pitch/interval, and their locations are known in advance, they can be easily computed without running any sweepline algorithm. By merely knowing the width and height of the overall design, and the pitch in each direction, the number of fixed shapes can be determined. The skilled person will be familiar with EDA data files and will be able to determine from same which metal shapes are fixed. See additional discussion of FIG. 2 below.

In one or more embodiments, run a set of algorithms (inside the routing tool) which employ a set of data structures and containers to hold objects in the memory so that computations can be done. These computations are quite costly as memory requirements grow, heretofore causing a huge increase in runtime (which can be addressed by one or more embodiments). In one or more embodiments, from these active and inactive shapes, a constraint graph is created to solve the routing problem. The size of the graph grows with the increase in metal shapes, which impact nodes and arcs of the graph. The memory requirements are divided between active and inactive shapes. Empirically, the memory is typically dominated by inactive shapes (due to their large count) in the design. In one or more embodiments, all the containers can be accessed with average case complexity of log n (n=number of metal shapes in design). There are typically two nodes per shape, beginning and end, so n can also be stated as the number of nodes divided by two.

Consider graph complexity due to inactive shapes. The presence of inactive shapes (e.g., power staples) introduces a large complexity in the graph. Inactive shapes typically come in a fixed interval and exponentially increase the size of the graph by adding a large count of nodes and arcs; inactive shapes typically dominate. The memory requirement due to active and inactive shapes can be formulated as:

$$M = n_1 x + n_2 x^n \qquad (1)$$

Figure 4:
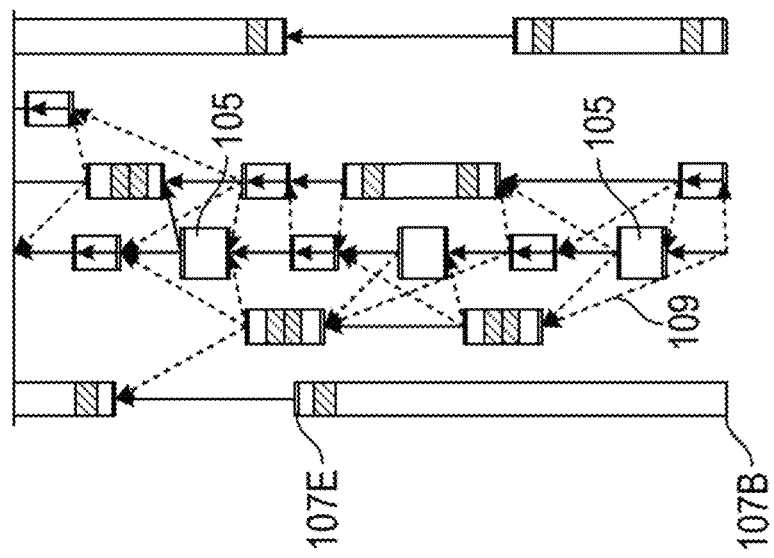
FIG. 4 shows aspects of a constraint graph with both active and inactive shapes, illustrating aspects of the invention.
Figure 3:
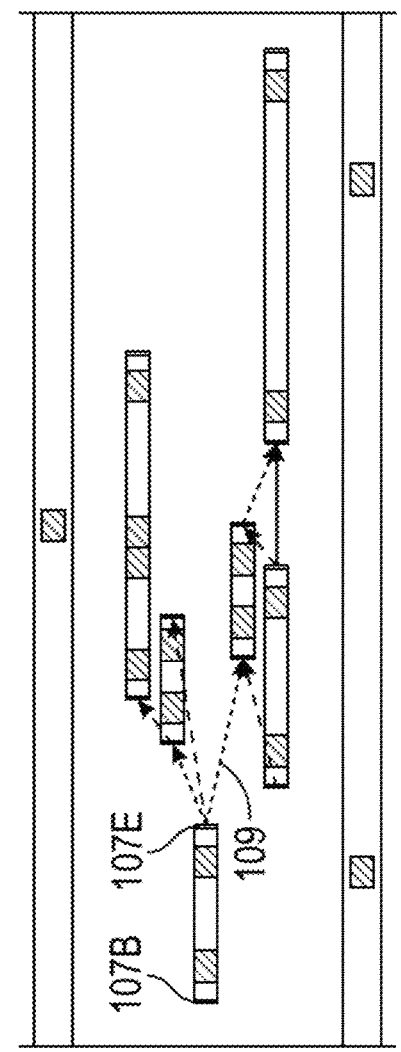
FIG. 3 shows aspects of a constraint graph with all only active shapes, illustrating aspects of the invention.

In the above, $n_1$ and $n_2$ are the count of, respectively, active and inactive shapes. Memory grows linearly for active shapes while polynomially for inactive shapes. The value of the polynomial exponent n can be deduced empirically from the data (e.g., n=2, 3, 4, . . . ). The parameter x can be understood as a minimum memory taken by a node and its dependent data structure such as arcs in the graph. So, for active metal the total memory will be: number of nodes multiplied by the minimum memory per node. This minimum memory is subject to the hardware and can be computed at run time; see discussion of memory per shape elsewhere herein—similar principles apply. FIG. 3 shows a constraint graph with only active shapes, while FIG. 4 shows a constraint graph with both active and inactive shapes 105 (e.g., staples). In FIG. 3, each metal end (107B=begin, 107E=end) is a node in the graph and the arrows 109 are the connections between them. The same is true in FIG. 4; the inactive shapes 105 are also included and each has two edge nodes, and connections, so that the graph is much more complicated than that in FIG. 3. Only one beginning metal end, one ending metal end, and one arrow 109 are numbered in each figure to avoid clutter.

Figures 5, 6:
FIG. 5 and FIG. 6 show memory computation and partitioning, according to aspects of the invention.

Consider now memory computation and partitioning. Referring to FIG. 5, in one or more embodiments, from all containers estimate (or empirically derive) the memory requirement M for worst case complexity, which gives an upper bound on the memory requirement. For example, referring to FIG. 6, suppose the total required memory=800 GB and the free memory=200 GB; this implies that 4 partitions Y are required (e.g., region1, region2, region3, region4). Round up to the next integer number of partitions where required (i.e., where total required memory divided by free memory is not an exact integer).

In an experiment, we found a significant runtime reduction in analysis of a large modern microprocessor—the run time reduced to 2 hours from 12 hours. Furthermore, a required memory of 700 GB to run a routing job was reduced to 200 GB (i.e., 3.5× reduction in memory demand). Indeed, many units can be easily run on an under 100 GB machine, which formerly required more than a 300 GB machine. This saves a significant amount of time for designers, as they do not have to wait for availability of a larger machine, and multiple routing jobs can be now submitted in a machine.

In one or more embodiments, partitioning also provides an opportunity for enabling controlled multithreading (i.e., while some embodiments run all the partitions separately, other embodiments run some or all of the partitions in parallel using multiple threads (although they may consume more memory than the case where all the partitions are run separately, so additional management is required)).

Thus, one or more embodiments provide system memory-aware circuit region partitioning, dynamic memory requirement computation based on metal shapes, and/or system memory-aware software design for EDA and the like.

One or more embodiments advantageously provide a system memory-aware circuit region partitioning for faster runtime and/or memory optimization. One or more embodiments compute the memory requirement on-the-fly based on metal shape processing and/or perform chip partitioning based on available free system memory and required program memory. Indeed, one or more embodiments solve the challenge of running routing for EDA of a large integrated circuit within a constrained information technology (IT) infrastructure environment. This is achieved, for example, by, for a given design, computing the memory requirement on the fly based on metal shape processing, with the metal shapes divided into active and inactive shapes; deriving an empirical model to compute the memory requirement; and performing chip partitioning based on available free system memory and required program memory. One or more embodiments partition at the routing stage 3111 rather than the placement stage 3105 (refer to discussion of FIG. 10). Furthermore, one or more embodiments are applicable to two-dimensional integrated circuits.

One or more embodiments thus provide on-the-fly memory requirement computation based on metal shape processing and/or available free system memory- and required program memory-driven chip partitioning.

Given the discussion thus far, it will be appreciated that an exemplary method is provided for increasing the efficiency of an electronic design automation process. The method includes, for a putative integrated circuit design for which computerized routing is to be carried out within an electronic design analysis program, running a sweep line algorithm (see FIG. 1 and accompanying text) selectively on active metal shapes 101 in said putative design for different layers of said putative design, to determine a total number of said active metal shapes. A memory requirement is then computed for computerized routing on said active metal shapes based on said total number of said active metal shapes. The skilled artisan will be familiar with the concept of a sweep line algorithm, from computational geometry, as an algorithmic paradigm that uses a conceptual sweep line or sweep surface to solve various problems in Euclidean space. The sweep line algorithm finds, for example, the beginning and end points of the active metal shapes, so that the number of active metal shapes can be determined and the memory requirements calculated as described herein. A "circuit design" is intended to cover an entire chip or a relevant sub-hierarchy thereof such as a unit or macro.

A further step includes, for said putative integrated circuit design, computing a memory requirement for computerized routing on inactive metal shapes based on a total number of said inactive metal shapes (see FIG. 2 and accompanying text). As discussed above, by merely knowing the width and height of the overall design, and the pitch in each direction, the number of fixed shapes can be determined. The skilled person will be familiar with EDA data files and will be able to determine from same which metal shapes are fixed. For example, in FIG. 2, divide the width by the horizontal pitch PH to approximate the number of shapes in the width direction, divide the height by the vertical pitch PV to approximate the number of shapes in the height direction, multiply the number of shapes in the width direction by the number of shapes in the height direction by the number of layers to determine the number of inactive metal shapes of this type.

Still a further step includes partitioning said putative integrated circuit design into a plurality of partitions, based on said memory requirement for computerized routing on said active metal shapes and said memory requirement for computerized routing on said inactive metal shapes, such that an available system memory is not exceeded. Refer to FIGS. 5 and 6 and accompanying text.

Yet a further step includes separately running a routing job on each of said plurality of partitions.

It will thus be appreciated that one or more embodiments increase the efficiency of EDA and/or the performance of the computer that implements the EDA because it is possible to handle more difficult problems with smaller machines and/or fewer computing resources (or to handle larger problems with the same resources). Further, one or more embodiments increase the performance of circuits designed with the EDA, at least compared to prior-art techniques using the same amount of computing resources.

In one or more embodiments, computing said memory requirement for computerized routing on said inactive metal shapes is carried out without running a sweep line algorithm on said inactive metal shapes.

One or more embodiments further include computing said available system memory on-the-fly (i.e., the memory in the system is queried while the chip partitioning program is actually running in that particular system).

Computing said memory requirement for said computerized routing on said active metal shapes and computing said memory requirement for said computerized routing on said inactive metal shapes includes, for example, applying the formula in Equation (1). As discussed above, M is the total memory requirement for said computerized routing on said active metal shapes and said computerized routing on said inactive metal shapes, $n_1$ is the count of said active shapes, $n_2$ is the count of said inactive shapes, and n is a polynomial exponent deduced empirically. In one or more embodiments, carry out a curve fit on some (e.g., 10) candidate test designs to determine n. In limited experiments, we found that a value of n=2 was appropriate, but other embodiments could use n=3, 4, or other suitable value.

Referring again to FIG. 5, in one or more embodiments, said partitioning of said putative integrated circuit design into said plurality of partitions comprises dividing said total memory requirement M by said available system memory Y and rounding to the next highest integer to obtain the integer number of partitions NP. The skilled person knows how to query the amount of free memory based on the operating system being used (e.g., free command in Linux). Any suitable procedure can be used to determine how to select the physical layout of the partitions; for example, a single row of NP partitions; two rows of NP/2 partitions if NP is even; $NP^{1/2}$ rows and $NP^{1/2}$ columns if NP is a perfect square, and so on.

Any techniques disclosed herein requiring mathematical calculations (e.g., Equation (1)), can be implemented, for example, by programming in a high-level language and compiling or interpreting into computer-executable code.

In one or more embodiments, said routing job enforces end-of-line design rules in extreme ultraviolet (EUV) technology.

Figure 10:
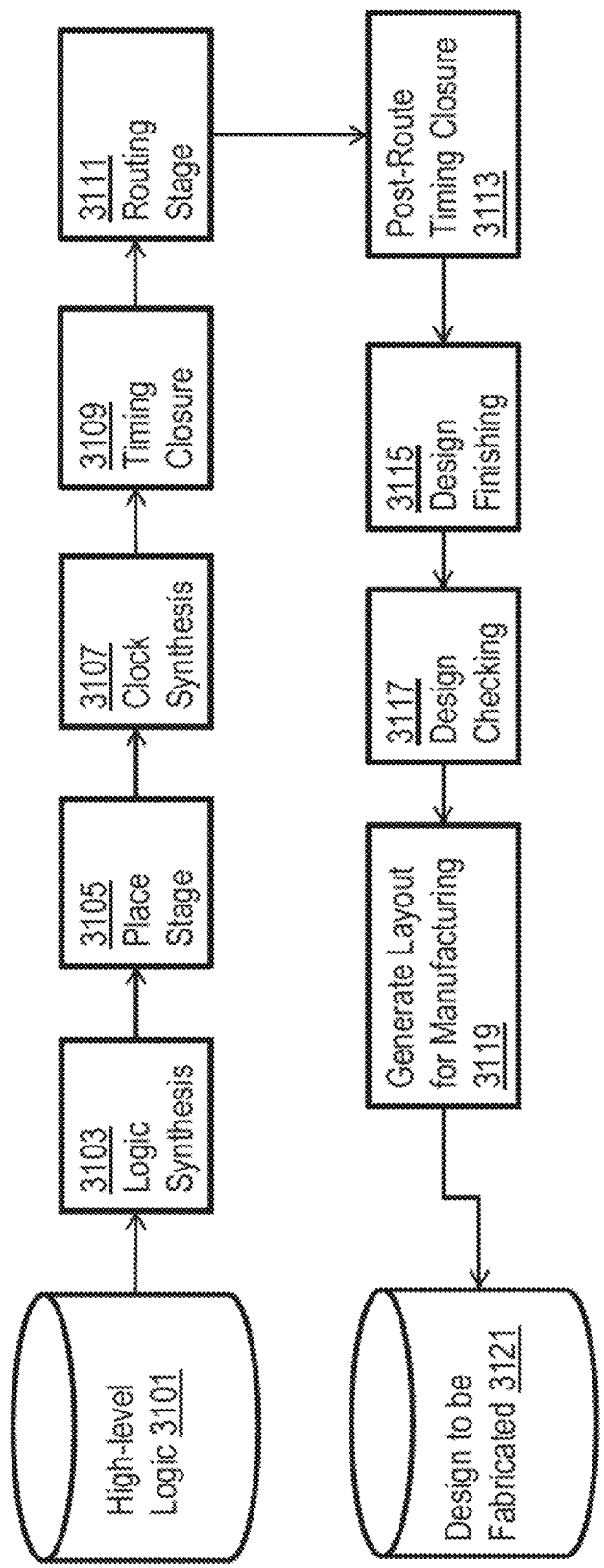
FIG. 10 shows an exemplary high-level Electronic Design Automation (EDA) tool flow, within which aspects of the invention can be employed.

Referring to FIG. 10 (discussed in detail below), in one or more embodiments, said partitioning step, said step of running said routing job, said step of computing said memory requirement for computerized routing on said active metal shapes, and said step of computing said memory requirement for computerized routing on said inactive metal shapes, are carried out at a routing stage 3111 and not at a placement stage 3105 of said electronic design automation process.

In at least some instances, said putative integrated circuit design is a two-dimensional design.

In one or more embodiments, referring to FIG. 6, separately running the routing job on each of said plurality of partitions is carried out sequentially; i.e., run the routing job on region1, then on region2, then on region3, and then on region4 (or one-at-a-time in any other desired order). On the other hand, in some cases, separately running said routing job on each of said plurality of partitions is carried out at least in part by multithreading. For example, simultaneously run the routing job on region1 in a first thread and region2 in a second thread (or multithread in any other combination of two or more regions).

As discussed above, in one or more instances, from the active and inactive shapes, a constraint graph is created to solve the routing problem. A constraint graph is a known concept in routing; a graph is created using metal shapes and some algorithmic solution is computed. The skilled artisan will be familiar with routing software available from, for example, Cadence Design Systems, Inc., San Jose, Calif., US and Synopsys, Inc., Mountain View, Calif., US. One or more embodiments can be implemented by routing using known software but breaking up the problem as described herein so that the constraint graph will fit in the system memory when running the software.

In one or all embodiments, from all containers, estimate (or empirically derive) the memory requirement for worst case complexity, which gives an upper bound on the memory requirement. These containers can be the arrays/lists discussed above; there can be multiple containers (e.g., for active and inactive shapes). From the containers, the memory requirements can be derived. These are summed to obtain the overall memory required where there are multiple containers/arrays.

One or more embodiments further include updating said putative integrated circuit design based on said routing on each of said plurality of partitions. For example, refer to below discussion of the routing stage 3111, which takes the placed/optimized design, and determines how to create wires to connect all of the components, without causing manufacturing violations. Post-route timing closure 3113 performs another set of optimizations to resolve any violations that are remaining after the routing. Design finishing 3115 then adds extra metal shapes to the netlist, to conform with manufacturing requirements. The checking steps 3117 analyze whether the design is violating any requirements such as manufacturing, timing, power, electromigration (e.g., using techniques disclosed herein) or noise. When the design is clean, the final step 3119 is to generate a layout for the design, representing all the shapes to be fabricated in the design to be fabricated 3121. The updated circuit design will be, for example, the result of the routing and/or additional steps.

One or more embodiments still further include fabricating a physical integrated circuit in accordance with the updated circuit design.

Figure 8:
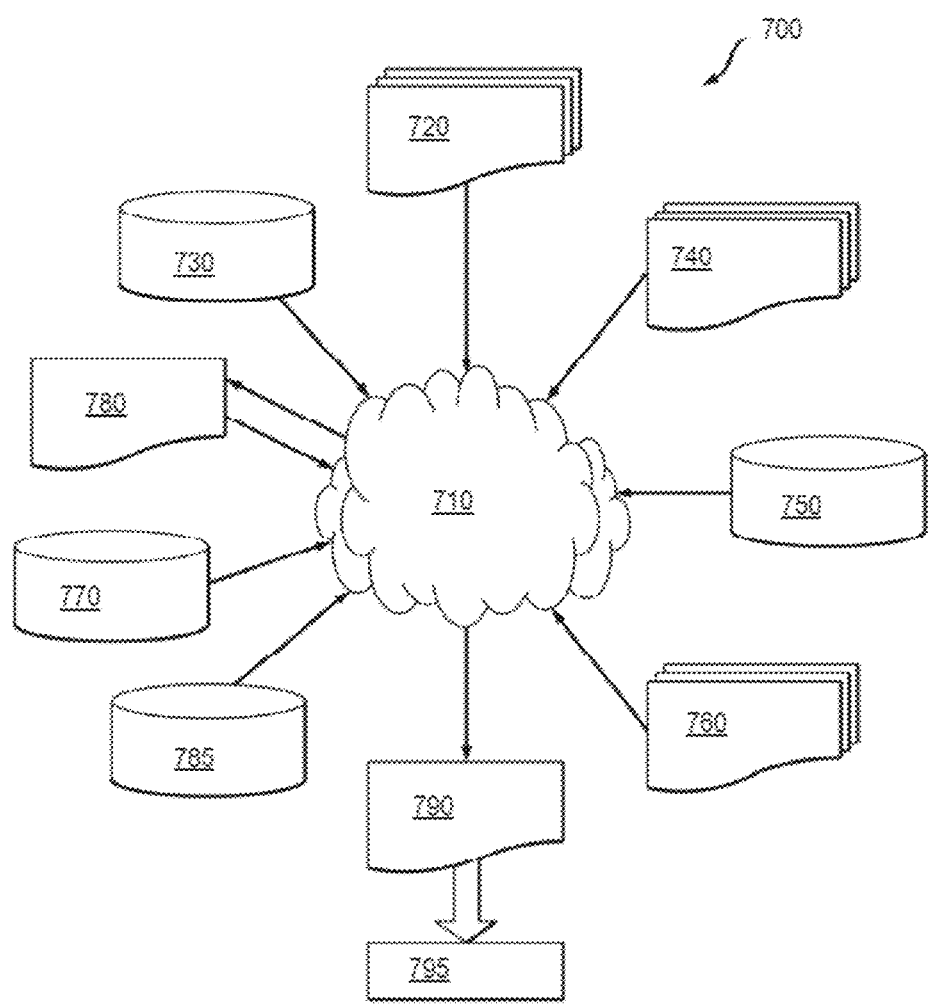
FIG. 8 is a flow diagram of a design process used in semiconductor design, manufacture, and/or test.
Figure 9:
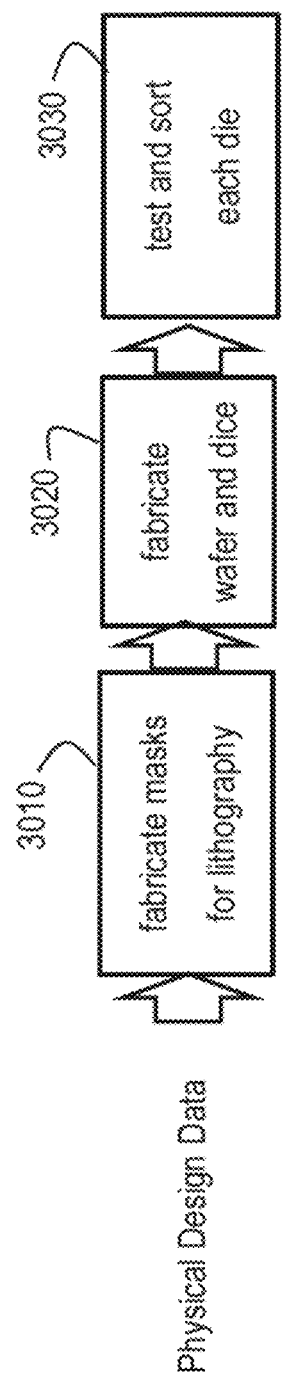
FIG. 9 shows further aspects of IC fabrication from physical design data.

For example, referring to FIGS. 8-10 discussed elsewhere herein, render the updated circuit design in a design language; and prepare a layout based on the updated circuit design rendered in the design language. Instantiate the layout as a design structure. The physical integrated circuit is then fabricated in accordance with the design structure.

Accordingly, in one or more embodiments, the layout is instantiated as a design structure. See discussion of FIG. 8. A physical integrated circuit is then fabricated in accordance with the design structure. See again discussion of FIG. 8. Refer also to FIG. 9. Once the physical design data is obtained, based, in part, on the analytical processes described herein, an integrated circuit designed in accordance therewith can be fabricated according to known processes that are generally described with reference to FIG. 9. Generally, a wafer with multiple copies of the final design is fabricated and cut (i.e., diced) such that each die is one copy of the integrated circuit. At block 3010, the processes include fabricating masks for lithography based on the finalized physical layout. At block 3020, fabricating the wafer includes using the masks to perform photolithography and etching. Once the wafer is diced, testing and sorting each die is performed at 3030 to filter out any faulty die.

Figure 7:
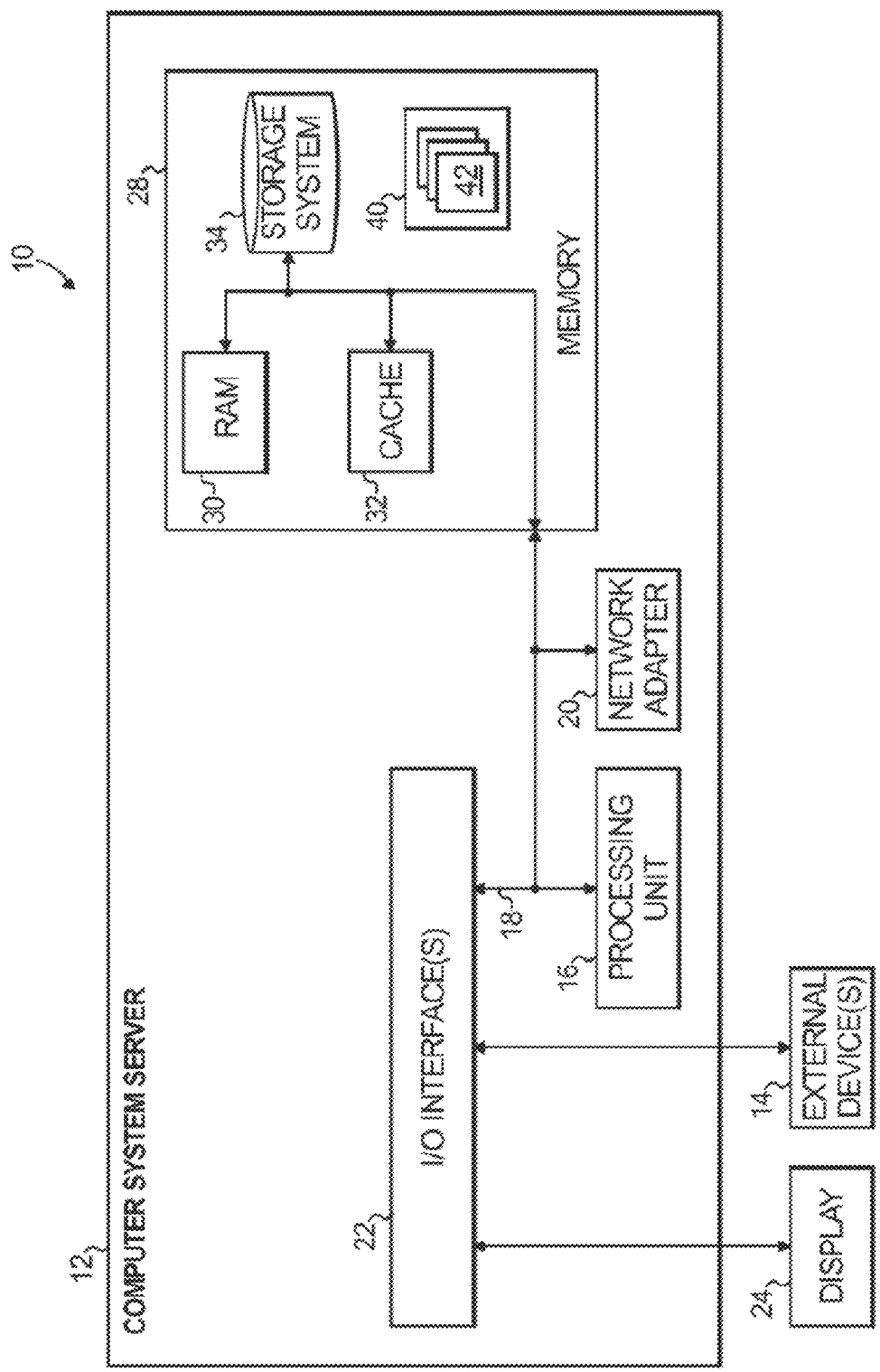
FIG. 7 depicts a computer system that may be useful in implementing one or more aspects and/or elements of the invention.

One or more embodiments include a computer including a memory 28; and at least one processor 16, coupled to the memory, and operative to carry out or otherwise facilitate any one, some, or all of the method steps described herein (as depicted in FIG. 7). In one or more embodiments, the performance (speed) of this computer is improved, for example, by reducing runtime and/or memory requirements; and/or, for fixed computer resources, the quality of an integrated circuit design is improved as compared to a circuit designed using prior art techniques.

Furthermore, referring to FIG. 8, in one or more embodiments the at least one processor is operative to generate a design structure for the circuit design in accordance with the routing, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure.

FIG. 10 depicts an example high-level Electronic Design Automation (EDA) tool flow, which is responsible for creating an optimized microprocessor (or other IC) design to be manufactured. A designer could start with a high-level logic description 3101 of the circuit (e.g. VHDL or Verilog). The logic synthesis tool 3103 compiles the logic, and optimizes it without any sense of its physical representation, and with estimated timing information. The placement tool 3105 takes the logical description and places each component, looking to minimize congestion in each area of the design. The clock synthesis tool 3107 optimizes the clock tree network by cloning/balancing/buffering the latches or registers. The timing closure step 3109 performs a number of optimizations on the design, including buffering, wire tuning, and circuit repowering; its goal is to produce a design which is routable, without timing violations, and without excess power consumption. The routing stage 3111 takes the placed/optimized design, and determines how to create wires to connect all of the components, without causing manufacturing violations. Post-route timing closure 3113 performs another set of optimizations to resolve any violations that are remaining after the routing. Design finishing 3115 then adds extra metal shapes to the netlist, to conform with manufacturing requirements. The checking steps 3117 analyze whether the design is violating any requirements such as manufacturing, timing, power, electromigration (e.g., using techniques disclosed herein) or noise. When the design is clean, the final step 3119 is to generate a layout for the design, representing all the shapes to be fabricated in the design to be fabricated 3121.

One or more embodiments of the invention, or elements thereof, can be implemented in the form of an apparatus including a memory and at least one processor that is coupled to the memory and operative to perform exemplary method steps. FIG. 7 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 7, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 7) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 8 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc. Improved latch tree synthesis can be performed as described herein.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for increasing the efficiency of an electronic design automation process, the method comprising:
for a putative integrated circuit design for which computerized routing is to be carried out within an electronic design analysis program, running a sweep line algorithm selectively on active metal shapes in said putative design for different layers of said putative design, to determine a total number of said active metal shapes, and computing a memory requirement for computerized routing on said active metal shapes based on said total number of said active metal shapes;
for said putative integrated circuit design, computing a memory requirement for computerized routing on inactive metal shapes based on a total number of said inactive metal shapes;
partitioning said putative integrated circuit design into a plurality of partitions, based on said memory requirement for computerized routing on said active metal shapes and said memory requirement for computerized routing on said inactive metal shapes, such that an available system memory is not exceeded; and
separately running a routing job on each of said plurality of partitions.

2. The method of claim 1, wherein computing said memory requirement for computerized routing on said inactive metal shapes is carried out without running a sweep line algorithm on said inactive metal shapes.

3. The method of claim 2, further comprising computing said available system memory on-the-fly.

4. The method of claim 3, wherein computing said memory requirement for said computerized routing on said active metal shapes and computing said memory requirement for said computerized routing on said inactive metal shapes comprises applying a formula:

$$M = n_1 x + n_2 x^n$$

wherein M is a total memory requirement for said computerized routing on said active metal shapes and said computerized routing on said inactive metal shapes, $n_1$ is a count of said active shapes, $n_2$ is a count of said inactive shapes, n is a polynomial exponent deduced empirically, and x is a minimum memory taken by a node and its dependent data structure.

5. The method of claim 4, wherein said partitioning of said putative integrated circuit design into said plurality of partitions comprises dividing said total memory requirement M by said available system memory and rounding to a next highest integer.

6. The method of claim 3, wherein said routing job enforces end-of-line design rules in extreme ultraviolet (EUV) technology.

7. The method of claim 1, wherein said partitioning step, said step of running said routing job, said step of computing said memory requirement for computerized routing on said active metal shapes, and said step of computing said memory requirement for computerized routing on said inactive metal shapes, are carried out at a routing stage and not at a placement stage of said electronic design automation process.

8. The method of claim 1, wherein said putative integrated circuit design comprises a two-dimensional design.

9. The method of claim 1, wherein said step of separately running said routing job on each of said plurality of partitions is carried out sequentially.

10. The method of claim 1, wherein said step of separately running said routing job on each of said plurality of partitions is carried out at least in part by multithreading.

11. The method of claim 1, further comprising updating said putative integrated circuit design based on said routing on each of said plurality of partitions.

12. The method of claim 11, further comprising fabricating a physical integrated circuit in accordance with said updated putative circuit design.

13. The method of claim 12, further comprising:
rendering said updated putative circuit design in a design language;
preparing a layout based on said updated putative circuit design rendered in said design language; and
instantiating said layout as a design structure;
wherein said physical integrated circuit is fabricated in accordance with said design structure.

14. A computer comprising:
a memory; and
at least one processor, coupled to said memory, and operative to increase the efficiency of an electronic design automation process by:
for a putative integrated circuit design for which computerized routing is to be carried out within an electronic design analysis program, running a sweep line algorithm selectively on active metal shapes in said putative design for different layers of said putative design, to determine a total number of said active metal shapes, and computing a memory requirement for computerized routing on said active metal shapes based on said total number of said active metal shapes;
for said putative integrated circuit design, computing a memory requirement for computerized routing on inactive metal shapes based on a total number of said inactive metal shapes;
partitioning said putative integrated circuit design into a plurality of partitions, based on said memory requirement for computerized routing on said active metal shapes and said memory requirement for computerized routing on said inactive metal shapes, such that an available system memory is not exceeded; and
separately running a routing job on each of said plurality of partitions.

15. The computer of claim 14, wherein said at least one processor computes said memory requirement for computerized routing on said inactive metal shapes without running a sweep line algorithm on said inactive metal shapes.

16. The computer of claim 15, wherein said at least one processor is further operative to compute said available system memory on-the-fly.

17. The computer of claim 16, wherein computing said memory requirement for said computerized routing on said active metal shapes and computing said memory requirement for said computerized routing on said inactive metal shapes comprises applying a formula:

$$M = n_1 x + n_2 x^n$$

wherein M is a total memory requirement for said computerized routing on said active metal shapes and said computerized routing on said inactive metal shapes, $n_1$ is a count of said active shapes, $n_2$ is a count of said inactive shapes, n is a polynomial exponent deduced empirically, and x is a minimum memory taken by a node and its dependent data structure; and wherein said partitioning of said putative integrated circuit design into said plurality of partitions comprises dividing said total memory requirement M by said available system memory and rounding to a next highest integer.

18. The computer of claim 14, wherein said at least one processor is further operative to increase the efficiency of the electronic design automation process by:

updating said putative integrated circuit design based on said routing on each of said plurality of partitions;

render said updated putative circuit design in a design language;

prepare a layout based on said updated putative circuit design rendered in said design language;

instantiate said layout as a design structure; and provide said design structure to fabrication equipment to facilitate fabrication of a physical integrated circuit in accordance with said design structure.

19. A non-transitory computer readable medium comprising computer executable instructions which when executed by a computer performing an electronic design automation process cause the computer to perform a method which increases the efficiency of the electronic design automation process, the method comprising:

for a putative integrated circuit design for which computerized routing is to be carried out within an electronic design analysis program, running a sweep line algorithm selectively on active metal shapes in said putative design for different layers of said putative design, to determine a total number of said active metal shapes, and computing a memory requirement for computerized routing on said active metal shapes based on said total number of said active metal shapes;

for said putative integrated circuit design, computing a memory requirement for computerized routing on inactive metal shapes based on a total number of said inactive metal shapes;

partitioning said putative integrated circuit design into a plurality of partitions, based on said memory requirement for computerized routing on said active metal shapes and said memory requirement for computerized routing on said inactive metal shapes, such that an available system memory is not exceeded; and separately running a routing job on each of said plurality of partitions.

* * * * *